United States Patent
Royer

(10) Patent No.: US 8,610,499 B2
(45) Date of Patent: Dec. 17, 2013

(54) RADIO FREQUENCY (RF) AMPLIFIER UTILIZING A PREDISTORTION CIRCUIT AND RELATED TECHNIQUES

(75) Inventor: Mark A. Royer, Billerica, MA (US)

(73) Assignee: Auriga Measurement Systems, LLC, Chelmsford, MA (US)

(*) Notice: Subject to any disclaimer, the term of this patent is extended or adjusted under 35 U.S.C. 154(b) by 59 days.

(21) Appl. No.: 13/442,355

(22) Filed: Apr. 9, 2012

(65) Prior Publication Data

US 2012/0256686 A1 Oct. 11, 2012

Related U.S. Application Data

(60) Provisional application No. 61/473,945, filed on Apr. 11, 2011.

(51) Int. Cl.
H03F 1/26 (2006.01)

(52) U.S. Cl.
USPC .......................................... 330/149; 330/151

(58) Field of Classification Search
USPC ................... 330/149, 151, 285, 296; 375/297
See application file for complete search history.

(56) References Cited

U.S. PATENT DOCUMENTS

| | | | |
|---|---|---|---|
| 4,442,407 A | 4/1984 | Apel | |
| 4,994,757 A | 2/1991 | Bickley et al. | |
| 5,276,411 A | 1/1994 | Woodin, Jr. et al. | |
| 5,675,288 A | 10/1997 | Peyrotte et al. | |
| 5,781,069 A | 7/1998 | Baskin | |
| 5,892,404 A | 4/1999 | Tang | |
| 6,191,653 B1 | 2/2001 | Camp, Jr. et al. | |
| 6,646,501 B1 | 11/2003 | Wessel | |
| 6,703,897 B2 * | 3/2004 | O'Flaherty et al. | 330/149 |
| 6,788,151 B2 | 9/2004 | Shvarts et al. | |
| 6,914,487 B1 | 7/2005 | Doyle et al. | |
| 7,310,382 B2 | 12/2007 | Fondén et al. | |
| 7,321,264 B2 | 1/2008 | Kokkeler | |
| 7,330,072 B2 | 2/2008 | Brandt | |
| 7,330,073 B2 | 2/2008 | Persson et al. | |
| 7,359,680 B2 | 4/2008 | Klemmer | |

(Continued)

FOREIGN PATENT DOCUMENTS

WO  WO 2010/124297 A1  10/2010

OTHER PUBLICATIONS

Siemens; "Arrangement for the digital pre-distortion of an envelope tracking power amplifier," ip.com; Nokia Siemens Networks 2007; Aug. 20, 2007; 4 pages.
International Search Report of the ISA for PCT/US2012/033041 dated Dec. 19, 2012.
Written Opinion of the ISA for PCT/US2012/033041 dated Dec. 19, 2012.
Kelly Mekechuk, Wan-Jong Kim, Shawn P. Stapleton, Jong Heon Kim, Linearizing Power Amplifiers Using Digital Predistortion, EDS Tools and Test Hardware, Apr. 2004, High Frequency Electronics, Summit Technical Media, LLC, pp. 18-30 (7 pages).
Nugira, Nugira Hat Power Modulator, Nugira Limited 2008, pp. 1-2.
Juergen Carstens; "Arrangement for the digital pre-distortion of an envelope-tracking power amplifier," ip.com; Technical Disclosure; Nokia Siemens Networks; Aug. 20, 2007; 5 pages.
Invitation to Pay Additional Fees of the ISA for PCT/US2012/033041 dated Aug. 24, 2012.

Primary Examiner — Henry Choe
(74) Attorney, Agent, or Firm — Daly, Crowley, Mofford & Durkee, LLP

(57) ABSTRACT

An apparatus and technique for operating an RF amplifier having a pre-distortion processor and a drain modulation circuit includes generating a compensating drain bias signal having a value which is a function of an RF input signal, a sampled RF output signal and a sampled drain bias signal. The compensating drain bias signal is applied to the RF amplifier. By sampling both the drain bias signal and the RF output signal and providing drain feedback and RF output feedback signals to a pre-distortion processor, RF amplifier distortions can be linearized enabling the RF amplifier to operate over a bandwidth which exceeds the bandwidth of the drain modulation circuit (i.e., the RF bandwidth can exceed the bandwidth of the drain modulator).

7 Claims, 6 Drawing Sheets

(56) References Cited

U.S. PATENT DOCUMENTS

| | | |
|---|---|---|
| 7,365,599 B2 | 4/2008 | Filimonov et al. |
| 7,368,985 B2 | 5/2008 | Kusunoki |
| 7,411,449 B2 | 8/2008 | Klingberg et al. |
| 7,412,469 B2 | 8/2008 | Dalipi |
| 7,420,416 B2 | 9/2008 | Persson et al. |
| 7,427,896 B2 | 9/2008 | Jacobsson et al. |
| 7,482,869 B2 | 1/2009 | Wilson |
| 7,686,601 B2 | 1/2011 | Li |
| 7,990,214 B2 * | 8/2011 | Markowski .................. 330/136 |
| 2004/0198263 A1 | 10/2004 | Ode et al. |
| 2010/0060358 A1 | 3/2010 | Nentwig |
| 2011/0032032 A1 * | 2/2011 | Pinon .......................... 330/149 |

* cited by examiner

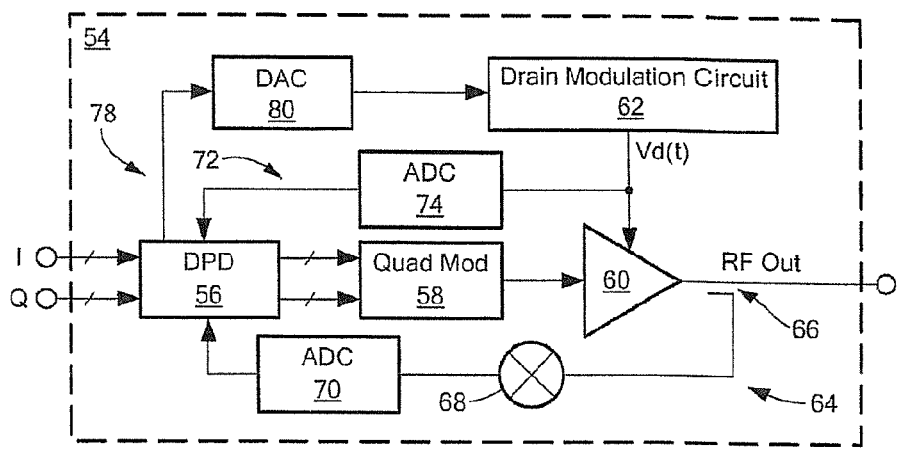
*FIG. 5*
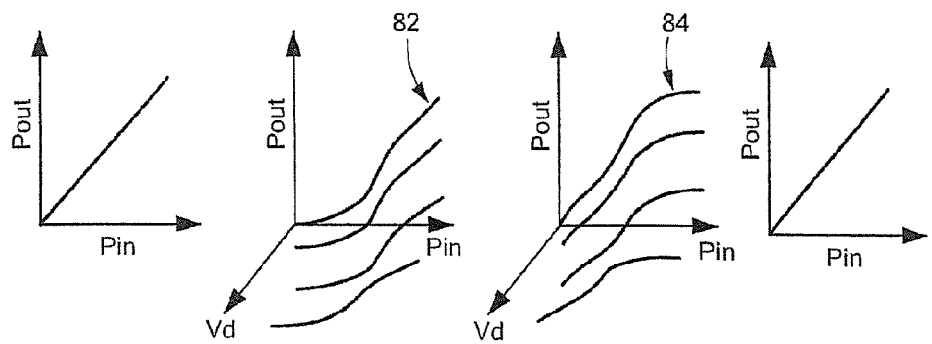
*FIG. 5A*  *FIG. 5B*  *FIG. 5C*  *FIG. 5D*

RADIO FREQUENCY (RF) AMPLIFIER UTILIZING A PREDISTORTION CIRCUIT AND RELATED TECHNIQUES

CROSS REFERENCE TO RELATED APPLICATION

This application claims the benefit of U.S. Provisional Application No. 61/473,945 filed Apr. 11, 2011 under 35 U.S.C. §119(e) which application is hereby incorporated herein by reference in its entirety.

GOVERNMENT RIGHTS

Not applicable.

FIELD OF THE INVENTION

The structures and techniques described herein relate to radio frequency (RF) circuits and more particularly to RF amplifier circuits.

BACKGROUND OF THE INVENTION

As is known in the art, in telecommunications systems, satellite systems and other systems, it is desirable for radio frequency (RF) power amplifiers (PAs) to linearly amplify RF signals in a highly efficient manner. Efficiency is generally proportional to input drive level. High efficiency is typically not attained until an amplifier approaches its maximum output power. This, however, is not consistent with linear operation. Thus, a tradeoff must typically be made between achieving maximum efficiency and high linearity in RF power amplifier circuits. Furthermore, an RF amplifier that compresses its input or has a non-linear input/output relationship may cause the output signal to spread onto adjacent radio frequencies. This can be a source of interference on other RF channels.

As is also known in the art, predistortion is a technique used to improve the linearity of RF transmitter amplifiers. Predistortion can be implemented using either analog and/or digital techniques.

In general, a predistortion circuit inversely models the amplifier's non-linear gain and phase characteristics and, when combined with the amplifier, produces an overall system that is more linear and reduces the amplifier's distortion. In essence, "inverse distortion" is introduced into the input of the amplifier, thereby reducing (or ideally, cancelling) any inherent non-linearity the amplifier might have.

Since RF power amplifiers tend to become more non-linear as their power increases towards their maximum rated output, predistortion is a technique which allows one to obtain additional usable RF power from an RF amplifier without having to utilize a larger amplifier. Since the cost of RF amplifiers typically rises as a function of the maximum RF power rating of the RF amplifier, in addition to improving performance, predistortion is also a cost-saving technique since utilizing predistortion increase a maximum RF power rating of an RF amplifier.

As is also known, the need for data-intensive communications (e.g., digital video) for warfighters deployed in the field has created a requirement for RF transmitters having an instantaneous RF bandwidth of 20 MHz or more. Concurrently, there is a demand for improved efficiency in RF front-ends to increase battery life, reduce weight, and reduce operating cost. Achieving an acceptable efficiency over a necessary modulation bandwidth has proven to be a difficult challenge.

Referring now to FIG. 1, one state-of-the-art method for improving the effectiveness of communication transmitters without sacrificing efficiency is utilizing envelope-tracking technology. As illustrated in FIG. 1, an envelope-tracking RF amplifier circuit includes an amplifier 12 having a drain modulation circuit 14 coupled thereto. Drain modulation circuit 14 changes the drain voltage provided to transmitter power amplifier 12 in time in accordance with the amplitude of a modulated RF signal 16 as shown in FIG. 1. Envelope-tracking transmitters ideally minimize wasted DC power and exhibit much higher efficiency compared to conventional, fixed-drain power amplifiers.

In state-of-the-art envelope-tracking transmitters, the instantaneous RF bandwidth is limited to the bandwidth of the drain modulator which is typically in the range or about 5 MHz to about 10 MHz. While this is sufficient for some applications (e.g. current warfighter needs), it will soon be superseded by future demands and the ability to achieve 20 MHz or more bandwidth at high power and high efficiency is desired. In order to meet these requirements, it is necessary to generate a clean, accurate envelope. This becomes exceedingly difficult and impractical, for example, when designing around extensive selection of military waveforms with high crest factors.

SUMMARY OF THE INVENTION

In accordance with one aspect of the concepts, circuits and techniques described herein, it has been recognized that to increase or even maximize the efficiency improvement, an envelope-tracking transmitter requires a drain modulator whose bandwidth is at least equal to the RF signal bandwidth. Therefore, the bandwidth of the drain modulator becomes the limit of the RF signal bandwidth.

To address this problem, described herein is a technique to eliminate the bandwidth limit imposed by a drain modulator circuit. The technique described herein is referred to as "bandwidth-optimized drain modulation." With this technique, a drain modulator circuit can operate at a bandwidth lower than an RF signal bandwidth of an amplifier or conversely, the RF amplifier bandwidth can exceed the bandwidth of the drain modulator. This has a great benefit to communication systems, from handheld radios to base stations, where efficiency and bandwidth are both critical. In one aspect, the baseband processor time-aligns a bandwidth-optimized, drain-modulation signaled to an RF signal and then a pre-distortion function generates a compensating value taking into account RF input power, RF output power and drain voltage. The compensating value is then applied to the RF input signal (e.g. through a digital pre-distortion processor) and the drain modulated voltage (e.g. through a drain modulation circuit).

In accordance with a further aspect of the concepts described herein, a technique for operating an RF amplifier having a pre-distortion processor and a drain modulation circuit comprises (a) sampling an RF signal at an output of the RF amplifier, (b) sampling a drain signal applied to the RF amplifier; (c) generating a compensating drain voltage having a value which is a function of an RF input signal, the sampled RF output signal and the sampled drain voltage and (d) applying the compensating drain voltage to the RF amplifier.

With this particular arrangement, a bandwidth-optimized drain modulation technique to reduce or even eliminate a bandwidth limit imposed on the RF amplifier by the drain modulation circuit is provided. In state-of-the-art envelope tracking, if the bandwidth of the RF amplifier exceeds the bandwidth of the drain modulation circuit, then the RF amplifier output signal has unacceptable levels of signal distortion. These distortions cannot be linearized by standard predistortion techniques. However, by sampling both the drain signal and the RF output signal and providing drain feedback and RF output feedback signals to a pre-distortion processor, then the distortions can be properly linearized enabling the RF amplifier to operate over a bandwidth which exceeds the bandwidth of the drain modulation circuit (i.e., the RF bandwidth can exceed the bandwidth of the drain modulator). This technique results in an amplifier circuit having improvements in both efficiency and bandwidth compared with prior art systems that have to trade-off one for the other. Such improvements in efficiency and bandwidth have a great benefit to communication systems, from handheld radios to base stations, where efficiency and bandwidth are both critical factors in system design and fabrication.

In one embodiment, the RF amplifier may be provided as an RF amplifier for use in an RF transmitter.

In one embodiment, the methods improve the RF bandwidth of envelope-tracking transmitters.

In one embodiment, the circuit and techniques described herein can be used to improve the RF bandwidth of envelope-tracking transmitters utilizing baseband processing techniques.

In accordance with a further aspect of the concepts described herein, a method for digital pre-distortion in a radio frequency (RF) amplifier includes the unordered steps of (a) sampling an RF signal at an output of the RF amplifier, (b) sampling a bias signal applied to the RF amplifier and (c) generating a compensation signal having a value which is a function of an RF input signal, the sampled RF output signal and the sampled bias signal.

With this particular arrangement, an envelope tracking technique is provided. By generating a compensation signal which is a function of an RF input signal, a sampled RF output signal and a sampled bias signal, and applying the compensation signal to the RF amplifier an RF amplifier can be operated in a manner which is more efficient than conventional techniques. The compensation signal can be either a digital signal or an analog signal. In some embodiments, the compensation signal is provided as a drain voltage provided to an amplifier through a drain modulation circuit while in other embodiments the compensation signal is provided as a gate voltage while in still other embodiments, the compensation signal is provided as a combination of both a drain voltage and a gate voltage.

In one embodiment, sampling a bias signal applied to the RF amplifier comprises sampling a drain voltage applied to the RF amplifier and generating a compensation signal comprises generating a compensating drain voltage having a value which is a function of an RF input signal, the sampled RF output signal and the sampled drain voltage. The compensating drain voltage is applied to the RF amplifier through a drain modulation circuit. In one embodiment, a predistortion processor receives an RF input signal, the sampled RF output signal and the sampled drain voltage values and generates a digital value corresponding to the compensating drain voltage which is applied to the RF amplifier.

In accordance with a still further aspect of the concepts described herein, a radio frequency (RF) amplifier includes means for sampling an RF signal at an output of the RF amplifier, means for sampling a bias signal applied to the RF amplifier and means for generating a compensation signal having a value which is a function of an RF input signal, the sampled RF output signal and the sampled bias signal.

With this particular arrangement, a highly efficient RF amplifier is provided. The RF amplifier further includes means for applying the compensation signal to the RF amplifier. In one embodiment, the compensation signal corresponds to one or more of a drain voltage or a gate voltage.

In one embodiment, the means for sampling a bias signal applied to the RF amplifier includes means for sampling a drain voltage applied to the RF amplifier and the means for generating a compensation signal having a value which is a function of an RF input signal, the sampled RF output signal and the sampled bias signal comprises means for generating a compensating drain voltage having a value which is a function of an RF input signal, the sampled RF output signal and the sampled drain voltage. In one embodiment, the means for generating a compensation signal comprises a predistortion processor such as a digital predistortion (DPD) processor.

In accordance with a still further aspect of the concepts described herein, a method of operating a radio frequency (RF) amplifier having a drain modulator coupled thereto includes providing an RF signal to an RF input port of the RF power amplifier and providing a bandwidth optimized drain modulation signal to a drain terminal of the RF power amplifier, wherein the RF bandwidth is greater than drain modulation signal bandwidth.

With this particular arrangement, a method of operating an envelope tracking RF amplifier is provided. By generating a bandwidth optimized drain modulation signal as a function of an input signal, a sampled RF output signal and a sampled drain bias signal, and applying the bandwidth optimized drain modulation signal to the RF amplifier, the RF amplifier can be operated in a manner which is more efficient than conventional techniques. With this technique, a drain modulation circuit can operate at a bandwidth lower than an RF signal bandwidth (or stated differently, the RF amplifier can be efficiently operated over a bandwidth which exceeds the bandwidth of the drain modulator).

In accordance with a still further aspect of the concepts, circuits and techniques described herein, an RF amplifier circuit includes a predistortion processor circuit having a plurality of inputs and a plurality of outputs. An RF amplifying device has an input coupled to an output of the predistortion circuit, an output at which an RF output signal is provided and at least one control terminal. The RF amplifier circuit further includes a compensation circuit having an input and an output, with the output being coupled to at least one of the at least one control terminals of the RF amplifying device. A first feedback signal path is disposed to couple the output of compensation circuit to an input of the predistortion circuit. A second feedback signal path is disposed to couple the output of the RF amplifying device to an input of the predistortion circuit and a feedforward signal path is disposed to couple a signal from an output of the predistortion circuit to an input of the compensation circuit.

In one embodiment, the predistortion circuit is provided as a digital predistortion (DPD) circuit and the input of the RF amplifying device is coupled to the output of said digital predistortion circuit through a modulation circuit.

In one embodiment, the first feedback signal path comprises an analog-to-digital converter (ADC) circuit having an input coupled to the output of the compensation circuit and an output coupled to the input of the DPD circuit. The second feedback signal path comprises an RF coupler disposed at the output of the RF amplifying device to couple a portion of an RF output signal; a downconverter circuit configured to receive a portion of the coupled RF output signal and to convert the portion of the coupled RF output signal to an intermediate frequency (IF) signal; and an analog-to-digital converter (ADC) circuit disposed to receive the IF signal from the downconverter circuit and to provide a digital signal to the DPD circuit. The feedforward signal path comprises a digital-to-analog converter (DAC) circuit disposed to receive a digital signal from the DPD circuit and to provide an analog signal to said compensation circuit.

In one embodiment, the at least one control terminal of the RF amplifying device corresponds to a drain terminal of the RF amplifying device and the compensation circuit is provided as a drain modulation circuit.

It should, of course, be appreciated that in other embodiments the control terminal of the RF amplifying device may correspond to a gate terminal of the RF amplifying device in which case the compensation circuit would be provided as a gate modulation circuit. In still other embodiments, the RF amplifier may include at least two control terminals (e.g. a drain terminal and a gate terminal) and compensation signals may be provided to either or both of the control terminals.

In one embodiment, a first one of the control terminals the RF amplifying device is a drain terminal of the RF amplifying device and a second one of the control terminals of the RF amplifying device is a gate terminal of the RF amplifying device.

BRIEF DESCRIPTION OF THE DRAWINGS

The foregoing features of this invention, as well as the invention itself, may be more fully understood from the following description of the drawings in which:

FIG. 2A is a plot of RF signal voltage and drain modulation voltage vs. time which illustrates bandwidth-optimized, drain-modulation envelope tracking;

FIG. 5 is a block diagram of an RF amplifier circuit which utilizes DPD correction of amplifier distortions for bandwidth-optimized drain modulation;

FIGS. 5A-5D are a series of plots which illustrate input power ($P_{in}$) vs. output power ($P_{out}$) vs. drain voltage ($V_d$) characteristics at various portions of the RF amplifier circuit shown in FIG. 5.

DETAILED DESCRIPTION OF THE PREFERRED EMBODIMENTS

The technique described herein to mitigate the bandwidth limit imposed by the drain modulator is that of "bandwidth-optimized drain modulation." With this technique, the drain modulator can operate at a bandwidth lower than the RF signal bandwidth, or conversely, the RF bandwidth can exceed the bandwidth of the drain modulator. This has a great benefit to future communication systems, from handheld radios to base stations, where efficiency and bandwidth are both critical.

Figure 1:
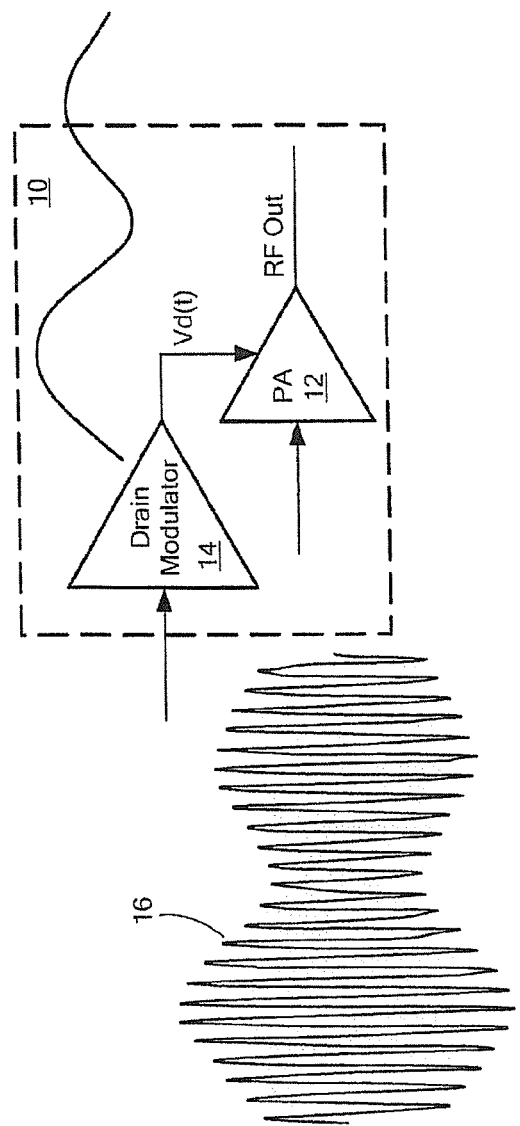
FIG. 1 is a block diagram of an exemplary envelope-tracking transmitter, whereby a modulated drain signal Vd(t) is provided to a drain terminal of a radio frequency (RF) amplifier.
Figure 2:
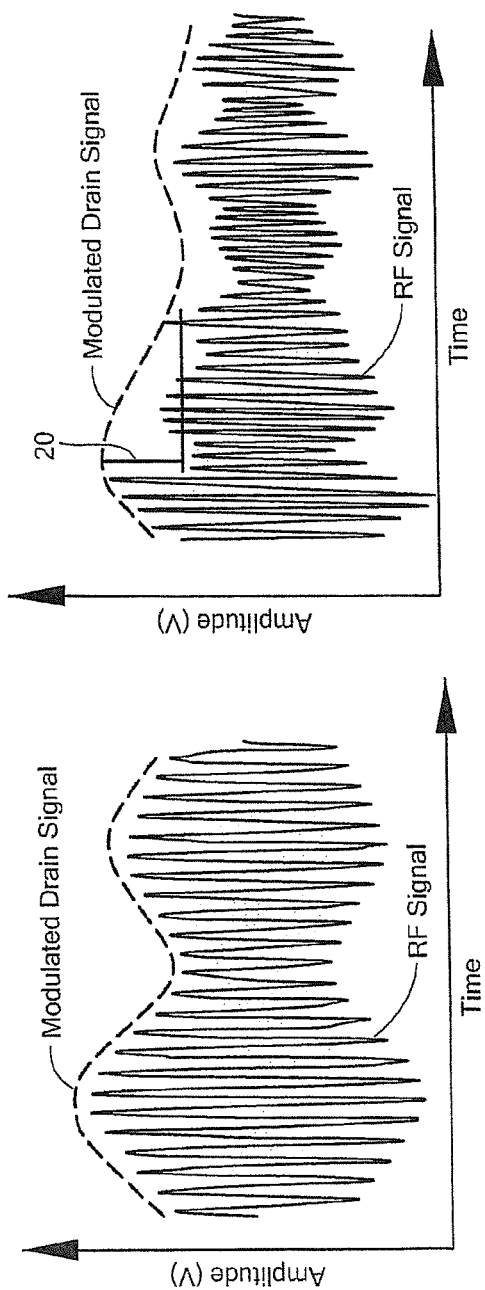
FIG. 2 is a plot of RF signal voltage and drain modulation voltage vs. time which illustrates traditional envelope tracking.

Referring now to FIGS. 2 and 2A, FIG. 2 is a plot of RF signal voltage and drain modulation voltage vs. time which illustrates traditional envelope tracking while FIG. 2A is a plot of RF signal voltage and drain modulation voltage vs. time which illustrates the bandwidth-optimized, drain-modulation envelope tracking technique described herein.

As can be seen from FIG. 2, a drain modulated voltage signal (dashed line in FIG. 2), closely follows the envelope of a modulated RF signal. Inspection of FIG. 2 reveals that for any given amplitude of RF signal, the drain voltage is proportional. Conventional techniques assume that the output power of an RF power amplifier varies monotonically with the input power. This assumption is valid for both the fixed drain voltage and traditional envelope-tracking cases. As a result, the drain modulated signal (dashed line in FIG. 2), closely follows the envelope of a modulated RF signal.

In contrast, and as can be seen from FIG. 2A, a drain modulated signal (dashed line in FIG. 2A), does not follows the envelope of a modulated RF signal as closely as shown in FIG. 2. Stated differently, in the case of a bandwidth-optimized drain modulation signal, the monotonic relation between $P_{in}$ and $P_{out}$ does not hold any more. The line designated by reference numeral 20 (FIG. 2A) illustrates that for each given amplitude of RF signal there will be many possible values of drain voltage. This is because in current practice, envelope tracking bandwidth performance is limited by drain modulation circuitry simply because state-of-the-art power modulation components can only deliver a signal to about 5 MHz or to about 10 MHz. Therefore, envelope-tracking a power amplifier (PA) having an RF bandwidth beyond the bandwidth of drain modulation circuitry is impractical with conventional drain modulation circuits and schemes.

Using the techniques described herein, however, the RF bandwidth can go much higher using the same, currently existing drain modulation circuit components thereby making it practical to provide an envelope-tracking a power amplifier (PA) having an RF bandwidth beyond the bandwidth of drain modulation circuitry. An unfortunate consequence is that the drain doesn't monotonically follow the RF signal values. This results in additional distortion and the inability of a conventional DPD to linearize the RF amplifier. Thus, using the techniques described herein (e.g. a DPD with drain feedback) it is possible to linearize an amplifier (e.g. a power amplifier) operating in a mode in which the amplifier has an RF bandwidth beyond the bandwidth of conventional drain modulation circuitry.

The line designated with reference numeral 20 in FIG. 2A illustrates that for any given amplitude of RF, the drain voltage is not always the same. The drain-voltage bias point of the power amplifier cannot be uniquely determined from the RF signal amplitude. It is instead a function of drain voltage history and the future trend of the RF signal level. As a result, the output power is not a monotonic function of input power, but is instead, dependent upon a third element, the drain voltage.

Conventional DPD circuits are not well equipped to handle the situation in which output power is not a monotonic function of input power.

Figure 3:
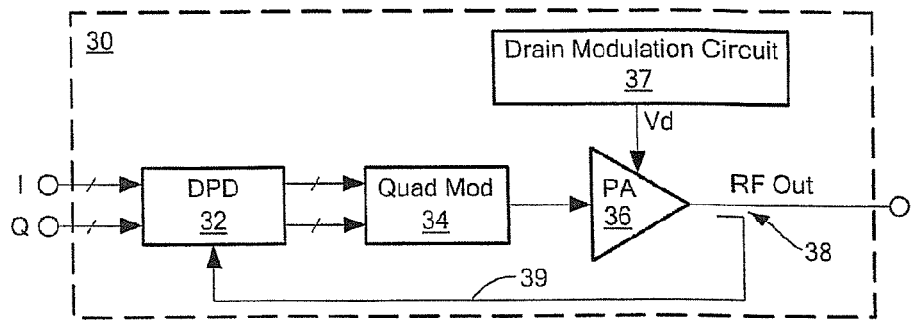
FIG. 3 is a block diagram of an RF amplifier circuit which includes a digital predistortion (DPD) circuit which provides first-order (DPD) correction of amplifier distortions for fixed-drain and envelope-tracking cases.
Figure 3A:
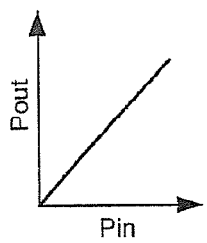
FIGS. 3A-3D are a series of plots which illustrate input power ($P_{in}$) vs. output power ($P_{out}$) characteristics at various portions of the RF amplifier circuit shown in FIG. 3.
Figure 3B:
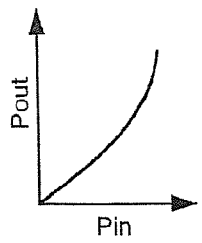
Figure 3C:
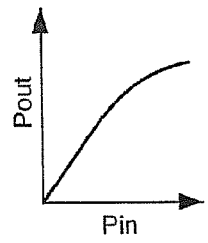
Figure 3D:
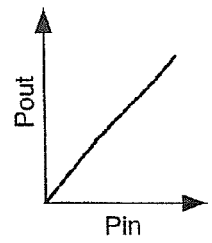

Referring now to FIG. 3, a prior art envelope tracking RF amplifier circuit 30 includes a predistortion (DPD) processor 32, a quadrature modulator and an RF power amplifier 36. A coupler 38 couples a portion of an RF signal from an output of RF amplifier 36 along a feedback signal path 39 to an input of DPD processor 32. DPD processor receives the RF output feedback signal provided thereto and provides a compensation value which helps provide envelope tracking RF amplifier circuit 30 having a linear amplifying response characteristic over a relatively wide range of RF input signal power levels.

As mentioned above, traditional DPD algorithms assume that the output power of an RF power amplifier (e.g. power amplifier 36 in FIG. 3) varies monotonically with the input power. This assumption is valid for both the fixed drain voltage and traditional envelope-tracking cases. As a result, existing DPD implementations can linearize those signals as illustrated by the plots of FIGS. 3A-3D.

Figure 4:
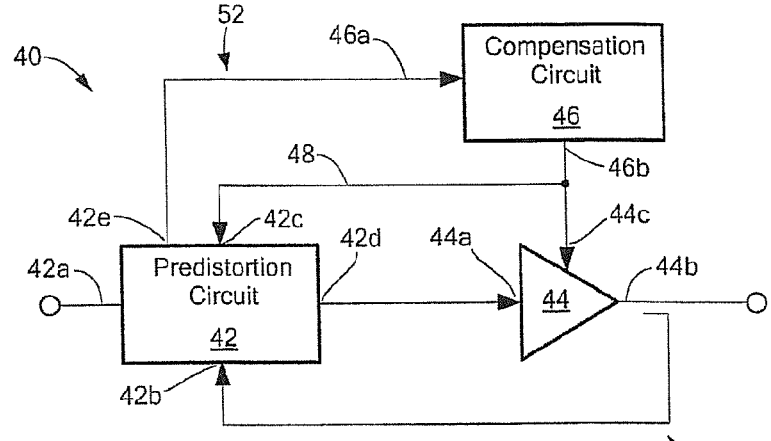
FIG. 4 is a block diagram of an RF amplifier circuit which utilizes predistortion correction of amplifier distortions for bandwidth-optimized drain modulation.

Referring now to FIG. 4, an RF amplifier circuit 40 includes a predistortion processor circuit 42 having a plurality of inputs 42a, 42b, 42c and a plurality of outputs 42d, 42e. An RF amplifying device 44 has an input 44a coupled to an output 42d of the predistortion circuit 42, an output 44b at which an RF output signal is provided and at least one control terminal with only one control terminal 44c being shown in FIG. 4. RF amplifier circuit 40 further includes a compensation circuit 46 having an input 46a and an output 46b, with the output being coupled to at least one of the at least one control terminals (here, control terminal 44c) of the RF amplifying device. A first feedback signal path 48 is disposed to couple the output of compensation circuit 46 to an input 42c of the predistortion circuit 42. A second feedback signal path 50 is disposed to couple the output of the RF amplifying device 44 to an input 42b of the predistortion circuit 42 and a feedforward signal path 52 is disposed to couple a signal from an output 42e of the predistortion circuit 42 to an input 46a of the compensation circuit 46.

In one embodiment, the predistortion circuit 42 is provided as a digital predistortion (DPD) circuit and the input of the RF amplifying device is coupled to the output of said digital predistortion circuit through a quadrature modulation circuit (such as the quadrature modulation circuit to be described below in conjunction with FIG. 5).

In one embodiment, the first feedback signal path 48 comprises an analog-to-digital converter (ADC) circuit having an input coupled to the output of the compensation circuit and an output coupled to the input of the DPD circuit. The second feedback signal path 50 comprises an RF coupler disposed at the output of the RF amplifying device to couple a portion of an RF output signal; a downconverter circuit configured to receive a portion of the coupled RF output signal and to convert the portion of the coupled RF output signal to an intermediate frequency (IF) signal; and an analog-to-digital converter (ADC) circuit disposed to receive the IF signal from the downconverter circuit and to provide a digital signal to the DPD circuit. The feedforward signal path comprises a digital-to-analog converter (DAC) circuit disposed to receive a digital signal from the DPD circuit and to provide an analog signal to said compensation circuit.

In one embodiment, the at least one control terminal of the RF amplifying device corresponds to a drain terminal of the RF amplifying device and the compensation circuit is provided as a drain modulation circuit.

It should, of course, be appreciated that in other embodiments the control terminal of the RF amplifying device 44 may correspond to a gate terminal of the RF amplifying device in which case the compensation circuit would be provided as a gate modulation circuit. In still other embodiments, the RF amplifier may include at least two control terminals (e.g. a drain terminal and a gate terminal) and compensation signals may be provided to either or both of the control terminals.

Referring now to FIG. 5, an envelope tracking RF amplifier circuit 54 includes a predistortion (DPD) processor 56, a quadrature modulator 58 and an RF amplifier 60, here said RF amplifier being any conventional amplifier and preferably being a high power amplifier. A drain modulation circuit 62 provides a drain voltage Vd to amplifier 60. A feedback signal path 64 couples a portion of the RF output signal to an input of DPD processor 56. In this particular embodiment, feedback signal path includes coupler 66, preferably an RF coupler, which couples a portion of an RF signal from the output of RF amplifier 60 to an input of a downconverter circuit 68. Downconverter 68 provides a down converted signal to an input of an analog-to-digital converter (ACD) 70. ADC 70 receives an analog signal provided thereto and converts the analog signal to a digital signal (i.e. a stream of bits) which is provided to the input of DPD processor 56. DPD processor 56 also receives a drain voltage feedback signal along feedback signal path 70. Feedback path 72 includes an ADC 74 which receives analog drain voltage Vd and converts the analog signal to a digital signal which is provided to an input of DPD processor 56. In some embodiments, DPD processor 56 is provided as a field programmable gate array (FPGA). Those of ordinary skill in the art will appreciate, of course, that DPD processor 56 may also be implemented as a specially programmed microprocessor, a digital signal processor (DSP), an application specific integrated circuit (ASIC) or any other type of processing device.

DPD processor 56 receives the RF output and drain voltage feedback signals provided thereto and provides a compensation value along feedforward path 78. The compensation value is based upon one or more characteristics of the RF input signal, one or more characteristics of the RF output feedback signal and one or more characteristics of the drain voltage feedback signal. This allows envelope tracking RF amplifier circuit 54 to have a linear amplifying response characteristic over a relatively wide range of RF input signal power levels each having a range of drain voltages. Feedforward path 78 includes a digital-to-analog (DAC) converter 80 which receives a digital signal from DPD processor 56 and provides an analog signal to drain modulation circuit 62.

In this technique, the bandwidth-optimized, drain-modulation and RF modulated signals may be generated using an algorithm digitally implemented in a processing device such as a specially programmed microprocessor, field programmable gate array (FPGA) chip, a digital signal processor, an application specific integrated circuit (ASIC) or any other type of processing device. The algorithm depends upon a full characterization of the amplifier the data from which, in a preferred embodiment, is downloaded to an FPGA. The signals are generated with a first-order, feed-forward, pre-distortion based upon the characterization information. The two signals are time-aligned to the one another in a baseband processor using a numerical analysis technique to minimize errors between feed forward and feedback signals. Then the DPD processor uses the drain voltage feedback signal and the RF output feedback signal to iteratively update compensation values using the aforementioned information and provides updated compensation values to drain modulation circuit 47 via DAC circuit 43.

As mentioned above, however, for the case of a bandwidth-optimized drain modulation signal, the monotonic relation between $P_{in}$ and $P_{out}$ does not hold any more. Line 20 of FIG. 2A shows that for any given amplitude of RF, the drain voltage is not always the same. This indicates that the power amplifier's drain-voltage bias point cannot be uniquely determined from the RF signal amplitude. Rather, power amplifier's drain-voltage bias point is instead a function of drain voltage history and the future trend of the RF signal level. As a result, the output power is not a monotonic function of input power, but is instead, dependent upon a third element, the drain voltage as indicated in FIGS. 5A-5D.

DPD processor 56 must, therefore, take into account the power amplifier characterization for feed-forward pre-distortion and a feedback tap of the drain voltage in addition to the RF output for the feed-back pre-distortion. As illustrated in FIGS. 5B, 5C, the DPD processor generate a surface (e.g. surface 82 in FIG. 5B) defined by the three parameters: input power, output power and drain voltage which is the inverse of surface 84 in FIG. 5C.

One trade-off that must be made when employing this technique is efficiency. In particular, the degradation of efficiency as the RF bandwidth increasingly exceeds the drain modulation bandwidth must be quantified and taken into account for a user to effectively implement the technique in a particular application. Then, an optimum (or substantially optimum) relation between the modulator bandwidth and RF bandwidth should be determined. It should be appreciated that the optimum relation between the modulator bandwidth and RF bandwidth may be application dependent. The efficiency will be maximized depending upon the required RF bandwidth of the application.

With the above arrangement, a technique for operating an RF amplifier at bandwidths wider than a bandwidth range of a drain modulator is provided. This technique results in an RF amplifier circuit having a drain modulator circuit which is relatively simple compared with drain modulator circuits used in conventional RF amplifiers having like bandwidths. The technique described herein also improves overall efficiency of an RF amplifier circuit suitable for use in a transmitter.

The bandwidth-optimized, drain-modulation signal and timing algorithms in baseband processing employ a lookahead processing buffer to generate the drain-modulation signal insuring that the voltage begins to change early enough to meet peak transients in the RF signal without exceeding the drain modulator circuitry capabilities. By using feedback samples of the drain voltage to the PA and the PA's RF output signal, the two signals can be properly time aligned at the PA by using a minimization of errors technique.

The DPD handles reduce-bandwidth, drain-modulation, PA operation by utilizing both drain modulation voltage feedback and sampled RF output feedback signals to produce modified feed-forward drain and RF signals with inverse distortion. The technique may, for example, utilize a voltera-like series calculation that builds up accurate pre-distortion calculations over time based upon feedback history.

A trade-off between transmitter efficiency and the amount the RF bandwidth exceeds the drain modulator bandwidth can be quantified using empirical techniques and stored in a storage device (e.g. a memory) for later use by a DPD or other processor.

The optimum condition for the drain modulator bandwidth for a given RF signal bandwidth can then be found. This can be done using an empirical techniques for example and storing the results in a storage device.

By implementing a bandwidth-optimized, drain-modulation technique, one can exceed the inherent limit of RF bandwidth imposed on envelope-tracking transmitters by the drain modulator, albeit with the trade-off of less efficiency improvement. This will lead to dramatically increased digital-data traffic over the same transmitter hardware implementation. Benefits include, but are not limited to, communication systems that require both higher data throughput and improved efficiency.

Figure 6:
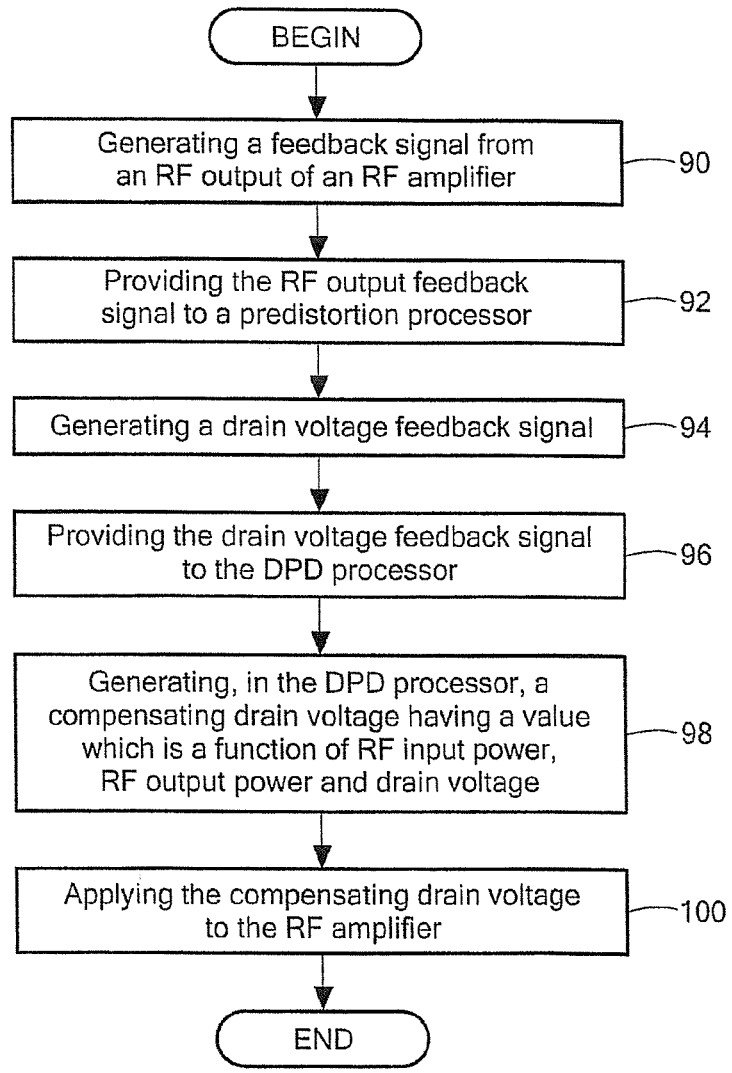
FIG. 6 is a flow diagram for a method of operating an RF amplifier using bandwidth-optimized drain modulation.
Figures 7, 8:
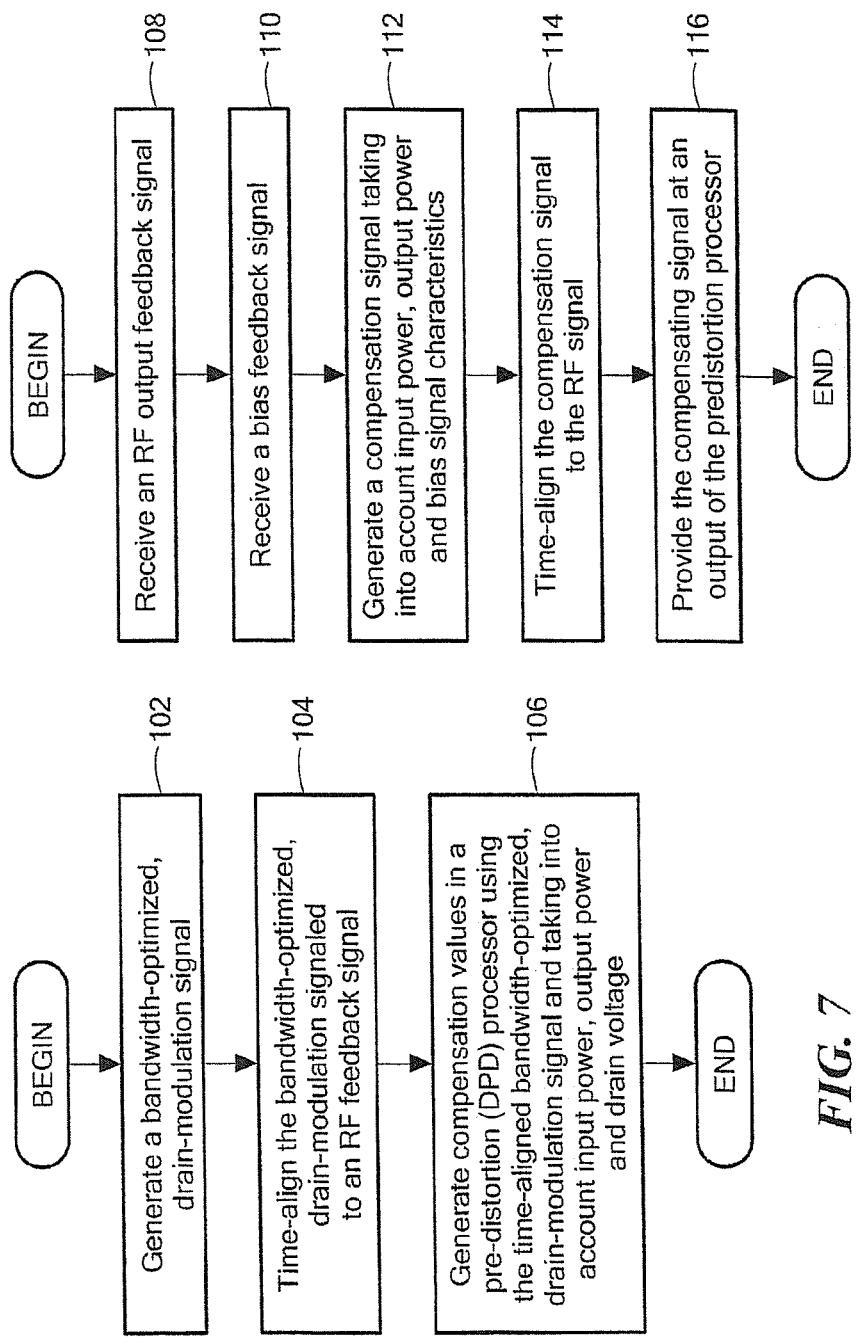
FIG. 7 is a flow diagram for a method of operating an RF amplifier.
FIG. 8 is a flow diagram for a method for generating a compensating drain voltage signal.

FIGS. 6-8 are a series of flow diagrams which illustrate the processing performed by a processing apparatus which may, for example, be provided as part of an envelope tracking RF amplifier (e.g. as part of DPD processor 56, FIG. 5, to generate predistortion values). The rectangular elements (typified by element 90 in FIG. 6), are herein denoted "processing blocks." Some of the processing blocks can represent an empirical procedure or a database while others can represent processor instructions or computer software instructions or groups of instructions.

Alternatively, the processing blocks may represent steps performed by functionally equivalent circuits such as a digital signal processor (DSP) circuit or an application specific integrated circuit (ASIC) or a field programmable gate array (FPGA). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that, unless otherwise indicated herein, the particular sequence of the processing described is illustrative only and, unless otherwise indicated, the sequence of the processing can be varied without departing from the spirit of the concepts described herein.

Turning now to FIG. 6, a method of operating an RF amplifier begins as shown in processing blocks 90 and 92 in which a feedback signal is generated from an RF output of an RF amplifier and provided to a DPD processor.

Processing then proceeds to processing blocks 94 and 96 in which a drain voltage feedback signal is generated and provided to the DPD processor.

Processing then proceeds to processing block 98 in which the DPD processor generates a compensating signal. In one embodiment, the DPD processor generates a compensating signal in digital form (i.e. the compensating signal is a digital signal having a digital value) which is delivered to a digital to analog (D/A) converter to generate an analog signal (e.g. an analog voltage signal) that is delivered to a bias circuit (e.g. a drain modulator circuit) to generate a bias signal (e.g. a high power drain modulation signal) for an amplifier (e.g. a power amplifier). It should thus, of course, be appreciated that the compensating signal (which is a function of an RF input power, RF output power and drain voltage) may be considered an analog signal or a digital signal depending upon where along the amplifier path one identifies the compensation signal.

Processing then proceeds to processing block 100 in which the compensation value (e.g. compensation drain voltage) is applied to the RF amplifier.

Referring now to FIG. 7, a method of operating an RF amplifier using bandwidth-optimized drain modulation begins in processing block 102 in which a bandwidth-optimized, drain-modulation signal is generated. Processing then proceeds to processing block 104 in which the bandwidth-optimized, drain-modulation signal is time-aligned to the RF signal. Processing then proceeds to processing block 106 in which a digital pre-distortion (DPD) algorithm is applied to the time-aligned bandwidth-optimized, drain-modulation signal taking into account input power, output power and drain voltage. this generates a compensation value which is used in the operation of an envelope tracking amplifier (e.g. the amplifier 44 of FIG. 4).

FIG. 8 is a flow diagram for a method for generating a compensating drain voltage signal. As shown in processing block 108, an RF output feedback signal is received or otherwise provided to a predistortion circuit which may be the same as predistortion circuit 42 in FIG. 4 or digital predistortion circuit 56 in FIG. 5. Processing then proceeds to processing block 110 in which a bias feedback signal is received or otherwise provided to the predistortion circuit. In one embodiment, the bias feedback signal is generated by a bias circuit (e.g. an RF amplifier bias circuit) and coupled to the predistortion processor. In one embodiment, the bias circuit is provided as a drain modulation circuit coupled to a drain terminal of an RF amplifier.

In processing block 112, the predistortion processor generates a compensation signal taking into account characteristics of an amplifying device including but not limited to input power, output power and drain voltage of the RF amplifying device (i.e. the values of compensation signal are a function of input power, output power and drain voltage of the RF amplifying device). In some embodiments, other circuit characteristics (including, but not limited to other characteristics of the amplifying device) may also be taken into account when generating the compensation signal values. In general; it is desirable to account for any circuit characteristics which affect the linear operation of the amplifier circuit.

In one embodiment, the compensation signal is a compensating drain voltage signal which is generated by taking into account input power, output power and drain voltage of an RF amplifying device.

In processing block 114, the compensating signal is time-aligned to an RF output signal. In one embodiment, a bandwidth-optimized, drain-modulation signal is time aligned to the RF output signal.

In processing block 116, the predistortion processor provides a compensation signal at an output port thereof. The compensation signal is then applied to the RF amplifier circuit (and in some embodiments, is applied to the RF amplifying device in the form of a bias signal). In one embodiment, the predistortion processor provides a compensation signal which corresponds to a compensating drain voltage signal which is applied to a drain terminal of an RF amplifying device through a drain modulation circuit. In other embodiments, the predistortion processor may provide a compensation signal which corresponds to a compensating gate or drain voltage signal which is applied to a date or source terminals of an RF amplifying device through an appropriate bias circuit.

Having described preferred embodiments which serve to illustrate various concepts, circuits and techniques which are the subject of this patent, it will now become apparent to those of ordinary skill in the art that other embodiments incorporating these concepts, circuits and techniques may be used. Accordingly, it is submitted that that scope of the patent should not be limited to the described embodiments but rather should be limited only by the spirit and scope of the following claims.

What is claimed is:

1. A radio frequency (RF) amplifier comprising:
   a predistortion circuit having a plurality of inputs and a plurality of outputs;
   an RF amplifying device having an input coupled to the output of said predistortion circuit, an output and at least one control terminal;
   a compensation circuit having an input and an output coupled to at least one of the at least one control terminals of said RF amplifying device;
   a first feedback signal path disposed to couple the output of said compensation circuit to an input of said predistortion circuit;
   a second feedback signal path disposed to couple the output of said RF amplifying device to an input of said predistortion circuit; and
   a feedforward signal path disposed to couple a signal from an output of said predistortion circuit to an input of said compensation circuit.

2. The RF amplifier of claim 1 further comprising a modulation circuit and wherein said predistortion circuit is provided as a digital predistortion (DPD) circuit and the input of said RF amplifying device is coupled to the output of said digital predistortion circuit through said modulation circuit.

3. The RF amplifier of claim 2 wherein the at least one control terminal of said RF amplifying device corresponds to a drain terminal of said RF amplifying device and said compensation circuit is provided as a drain modulation circuit.

4. The RF amplifier of claim 2 wherein:
   (a) said first feedback signal path comprises an analog-to-digital converter (ADC) circuit having an input coupled to the output of said compensation circuit and having an output coupled to the input of said DPD circuit;
   (b) said second feedback signal path comprises: an RF coupler disposed at the output of said RF amplifying device to couple a portion of an RF output signal; a downconverter circuit configured to receive a portion of the coupled RF output signal and to convert the portion of the coupled RF output signal to an intermediate frequency (IF) signal; and an analog-to-digital converter (ADC) circuit disposed to receive the IF signal from said downconverter circuit and to provide a digital signal to said DPD circuit; and
   (c) said feedforward signal path comprises a digital-to-analog converter (DAC) circuit disposed to receive a digital signal from said DPD circuit and to provide an analog signal to said compensation circuit.

5. The RF amplifier of claim 2 wherein the at least one control terminal of said RF amplifying device corresponds to a gate terminal of said RF amplifying device and said compensation circuit is provided as a gate modulation circuit.

6. The RF amplifier of claim 2 wherein said RF amplifying device comprises at least two control terminals.

7. The RF amplifier of claim 6 where a first one of the control terminals said RF amplifying device is a drain terminal of said RF amplifying device and a second one of the control terminals said RF amplifying device is a gate of said RF amplifying device.

* * * * *